United States Patent [19]
Bureau et al.

[11] Patent Number: 5,262,351
[45] Date of Patent: Nov. 16, 1993

[54] PROCESS FOR MANUFACTURING A MULTILAYER INTEGRATED CIRCUIT INTERCONNECTION

[75] Inventors: Jean-Marc Bureau, Palaiseau; François Bernard, Les Ulis; Dominique Broussoux, Marcoussis; Claude Vergnolle, Limours, all of France

[73] Assignee: Thomson-CSF, Puteaux, France

[21] Appl. No.: 734,671

[22] Filed: Jul. 23, 1991

[30] Foreign Application Priority Data

Aug. 21, 1990 [FR] France ................... 90 10514

[51] Int. Cl.$^5$ .................. H01L 21/28; H01L 21/56; H01L 21/58; H01L 21/60
[52] U.S. Cl. ............................ 437/183; 437/208; 437/215; 437/915
[58] Field of Search ............ 437/183, 190, 228, 183, 437/184, 208, 215, 218, 915; 156/643; 257/700, 676, 778, 779, 780

[56] References Cited

U.S. PATENT DOCUMENTS

| | | | |
|---|---|---|---|
| 3,918,148 | 11/1975 | Magdo et al. | 437/183 |
| 4,545,610 | 10/1985 | Lakrtiz et al. | 437/183 |
| 4,561,011 | 12/1985 | Kohara et al. | 257/778 |
| 4,612,083 | 9/1986 | Yasumoto et al. | 156/643 |
| 4,740,700 | 4/1988 | Shaham et al. | 437/180 |
| 5,049,523 | 9/1991 | Coleman, Jr. | 148/DIG. 164 |
| 5,071,787 | 12/1991 | Mori et al. | 437/183 |

FOREIGN PATENT DOCUMENTS

| | | |
|---|---|---|
| 0029334 | 5/1981 | European Pat. Off. |
| 0091072 | 10/1983 | European Pat. Off. |
| 0103889 | 3/1984 | European Pat. Off. |
| 2312172 | 12/1976 | France |
| 2634322 | 1/1990 | France |
| 53-14564 | 9/1978 | Japan ................... 437/183 |
| 2202673 | 9/1988 | United Kingdom |

OTHER PUBLICATIONS

IBM Technical Disclosure Bulletin, vol. 22, No. 5, Oct. 1979, pp. 1839-1840, New York, U.S.
B. T. Clark, et al. "Integrated Stacking Spacer for Metallized Ceramic Modules".
IBM Technical Disclosure Bulletin, vol. 8, No. 10, Mar. 1966, pp. 1325-1326, New York, U.S.
N. E. Beverly, et al. "Multilayer Electronic Package" Optics Communications, vol. 73, No. 1, Sep. 1, 1989 pp. 23-31 Amsterdam, NL.
J. J. Cousty, et al. "Study of Grooves in Silicon Chip as Means of Optical Interconnections in VLSI Circuits".

*Primary Examiner*—Olik Chaudhuri
*Assistant Examiner*—David E. Graybill
*Attorney, Agent, or Firm*—Oblon, Spivak, McClelland, Maier & Neustadt

[57] ABSTRACT

The invention is a method of producing a multilayer polymer-metal system to interconnect integrated circuits which allows two-dimensional electrical and/or optical connections between components, in which a first layer of polymer is deposited on a rigid substrate such that the layer can be separated from the substrate, in which a multilayer interconnection system is then produced on this first layer using industrial methods and in which the rigid substrate is removed after installation and connection of the integrated circuit.

11 Claims, 5 Drawing Sheets

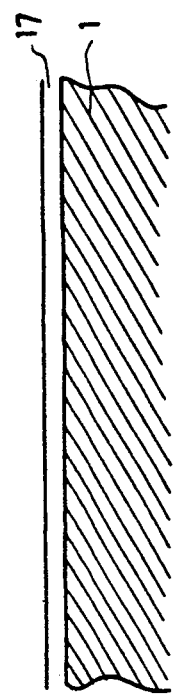
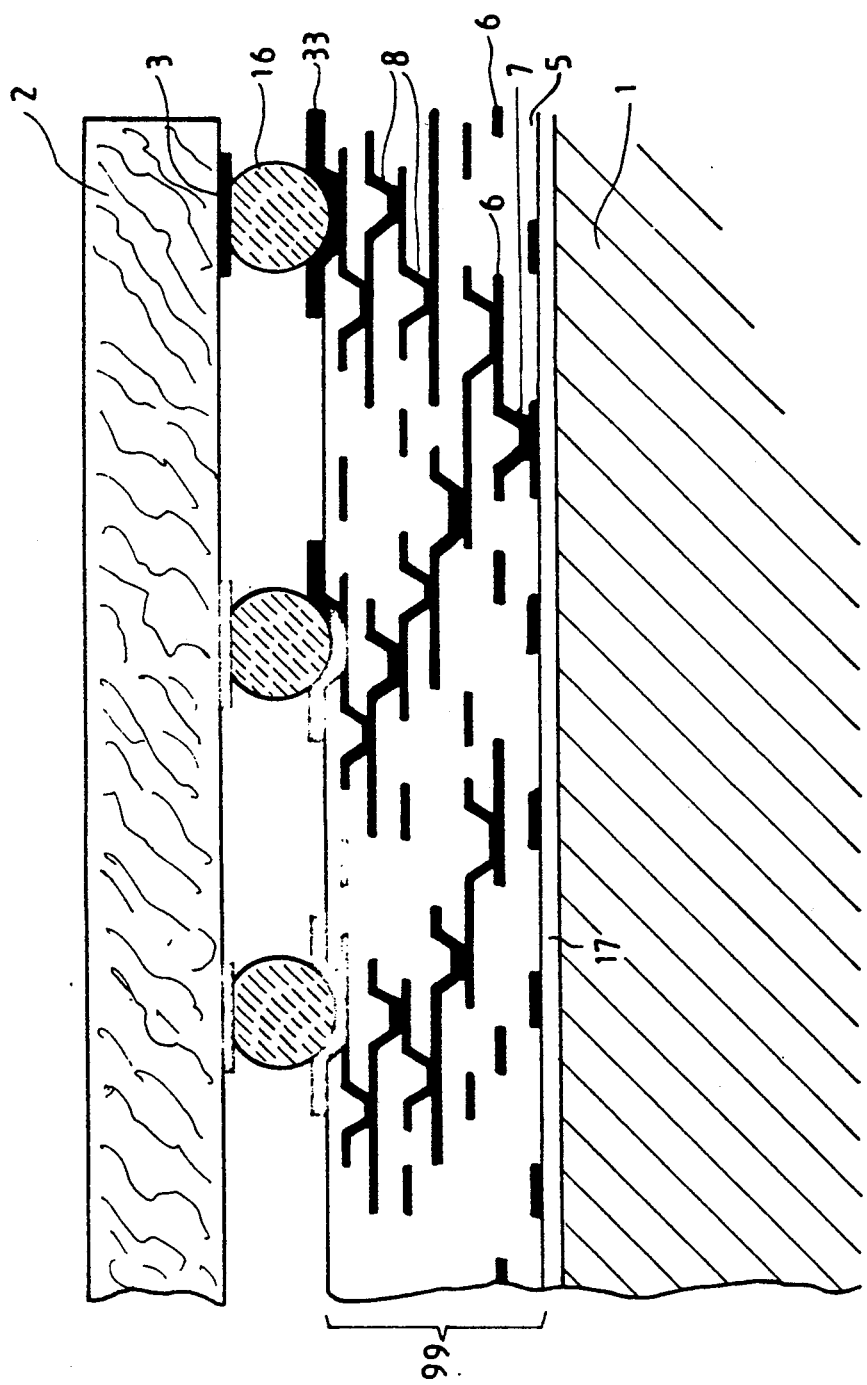

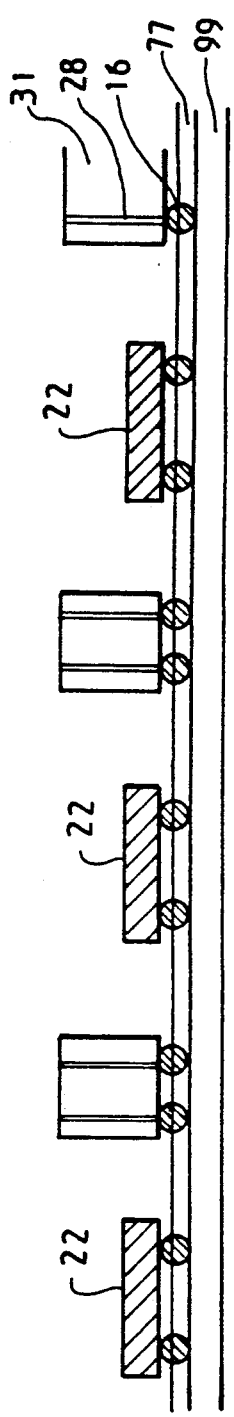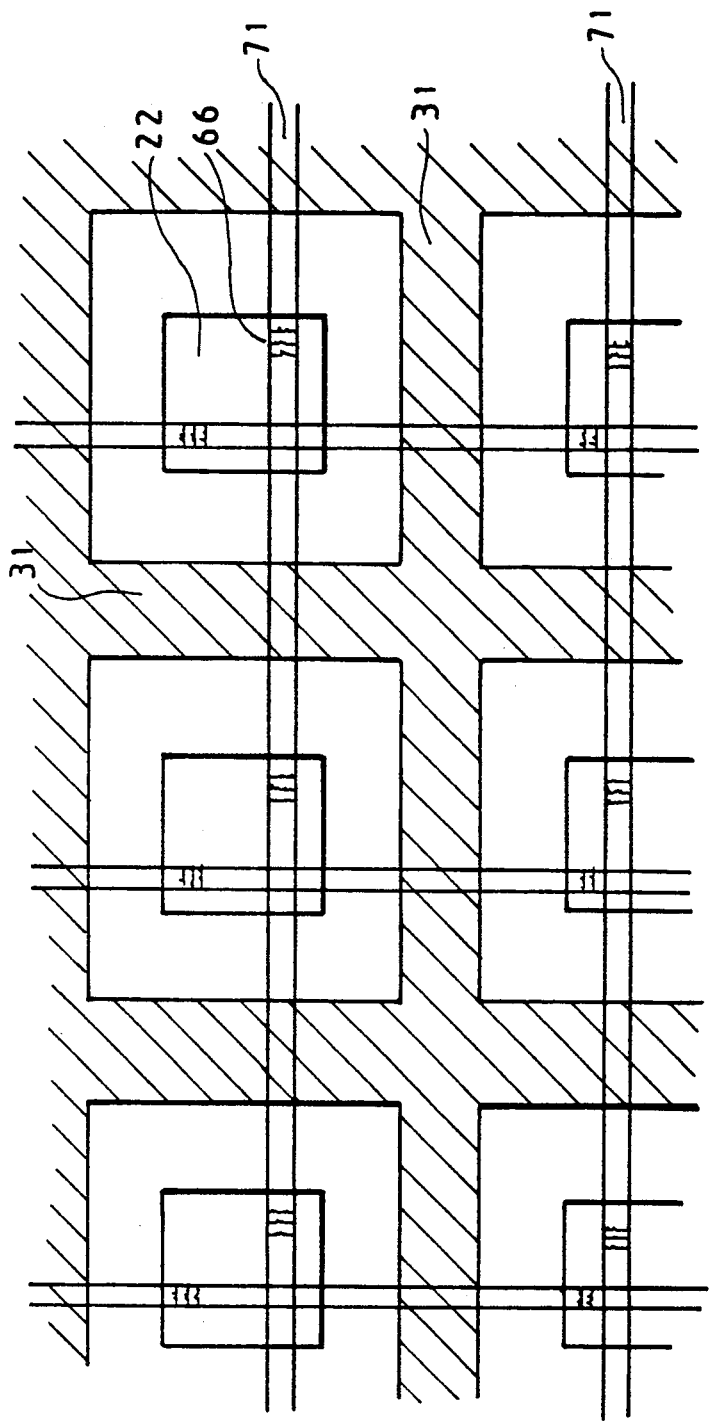
FIG.8a
FIG.8b

PROCESS FOR MANUFACTURING A MULTILAYER INTEGRATED CIRCUIT INTERCONNECTION

BACKGROUND OF THE INVENTION

This invention is a system of assembling and interconnecting circuits and the method of manufacturing this system. The invention is a two-dimensional (2D) system to electrically interconnect circuits and a system to electrically interconnect the 2D systems produced to form a three-dimensional (3D) structure.

The invention is also a 2D or 3D system to assemble and electrically and/or optically interconnect integrated circuits.

The invention is also a process to manufacture such integrated circuit interconnection systems.

The system according to the invention is a self-supporting multilayer polymer-metal sheet on which the circuits are connected.

DESCRIPTION OF THE PRIOR ART

In the prior art, integrated circuits ("chips") are assembled on 2D interconnection circuits on a rigid substrate (hybrid module or printed circuit, also known as a "board"). Several of these modules or boards may also be assembled into a 3D structure either by electrical connectors around the periphery of the modules or boards, themselves connected into a rigid structure designed to accommodate the modules or boards and to electrically connect them together and to the outside, or by stacking modules or boards with electrical interconnections between neighboring modules or boards.

The continuing growth in the number of electronic components assembled in modern equipment and increasing miniaturization means that the number of connections required between components in complex circuits is becoming a factor which limits the progress of the state of the art.

In parallel, the growing complexity of circuits, the increasing number of electronic signal inputs and outputs (I/O), the increasing number of signals transmitted in and between the circuits and the decreasing physical magnitude (current, voltage) of the signals is leading to increased problems with the reliability of interconnections.

The current trend in interconnection systems for "very large scale integration" circuits (VLSI) is towards a hybrid system in which bare chips are interconnected directly by a common substrate which forms the mechanical support for the circuits, includes the interconnections between the circuits and the connections to the outside and, frequently, serves as a heat sink for the heat dissipated by certain components.

The substrate, with the number of add-on bare chips and its several dielectric layers, separating several metallic interconnection layers, is then enclosed in a hermetically-sealed housing (the technique is known as "multichip packaging").

The criteria used to design an interconnection system, whose importance varies depending on the specific application, are, therefore, parameters such as the density, efficiency, performance, reliability, heat dissipation, etc. In choosing an interconnection system, it is frequently necessary to compromise between these parameters.

Of the many dielectrics which can be used to separate the various conductive layers, polyimides or other thermostable polymers such as, for example, polyphenylquinoxalines are appreciated for their ease of use (deposition, opening of vias for connections between conductive layers, planarization, etc.) and for their low dielectric permittivity (compared to mineral dielectrics) which allows them to be used at higher frequencies.

The use of multilayer polyimide-metal (Al or Cu) interconnections on different types of substrates is well known in the prior art.

For example, it is known that silicon can be used as a substrate, in combination with monolithic lithographic techniques, to obtain high-density multilayer interconnection systems. The equipment and know-how used for normal microelectronic processes applied to silicon can be used directly, providing high resolution and, therefore, a dense interconnection system with a high yield in manufacture.

The integrated circuits ("chips") are then assembled onto the interconnection system and connected by techniques known to industry, the most common being tape automated bonding (TAB), the flip-clip or wirebonding. In all these interconnection systems known to prior art, the limits in terms of connection density, performance and reliability lie, to a large extent, in the electrical connection of the chips.

Consequently, to connect these chips, it has been proposed to use techniques derived from known integrated circuit processes (lithography, thin-film deposition, etc.) applied to a monolithic substrate to obtain the high density, high performance, reliability and high yield in manufacture which these techniques, already widely used in silicon microelectronics, offer.

Because these processes are basically planar, it then becomes necessary to place the surface of the integrated circuit and that of the substrate at the same level. In the prior art, this was achieved by cutting recesses into the silicon substrate, positioning and attaching the chips in these recesses and then "planarizing" which involves covering the surface with organic resin to make it flat FIG. 1.

Three problems encountered with this technique are the difficulty of correctly locating the chip relative to the interconnection pads on the substrate, the extreme difficulty of replacing faulty chips and the mechanical stresses caused by differences in the thermal coefficients of expansion of the different materials.

Another technique proposed is to bond a "Kapton" film onto chips already located on a substrate and then define the interconnections directly using a microprocessor-controlled laser. This method not only presents the same repair problems as the previous method (the interconnection system must be remanufactured if a faulty chip is replaced) but only allows a relatively low interconnection density.

These two-dimensional (2D) interconnection structures on substrates, in addition to the disadvantages mentioned above, all present difficulties in making electrical connections through the substrate, which is essential for a 3D structure.

It has also been proposed to produce a three-dimensional (3D) interconnection structures by stacking 2D structures (FIG. 2). In a 3D interconnection system using these methods, the substrate thickness, approximately 500 microns, represents a large part of the overall volume. In addition, it is technologically extremely difficult to make electrical connections through the substrates.

The purpose of this invention is precisely to overcome these disadvantages of the prior art, both in two-dimensional and three-dimensional interconnection systems.

SUMMARY OF THE INVENTION

The invention overcomes all the disadvantages of using a substrate in an interconnection system, i.e. it eliminates all steps required to work the substrate such as machining the recesses, positioning chips, planarization, etc. In a three-dimensional interconnection system, the invention avoids the use of the substrate and thus improves the number of active components and interconnections that can be provided within a given volume and eliminates the problems of making connections through the substrate.

The invention only uses a rigid substrate in certain stages in manufacture and this substrate is then removed.

The system described in the invention can be easily adapted for 2D and 3D optical interconnection of circuits comprising optoelectronic emitters and detectors.

One aspect of the invention is, therefore, a method of producing a hybrid structure using a multilayer polymer-metal integrated circuit interconnection system to make electronic and/or optical connections in two dimensions, in which a multilayer interconnection system is produced on a rigid substrate but can subsequently be removed from the substrate, in which the integrated circuits are placed on the multilayer and in which the rigid substrate is removed after installation and connection of the integrated circuits.

The interconnection system carrying the chips, connected together, is then self-supporting.

Another aspect of the invention is a method of producing hybrid structures with three-dimensional optical and/or electrical interconnections in which self-supporting multilayer 2D interconnection systems are produced as described in the above paragraph and in which, once the rigid substrate has been removed, connection points are produced on the face of the multilayer interconnection system left accessible when the substrate is removed and in which these two dimensional multilayer interconnection systems are then stacked and connected together by way of said connection points.

An embodiment of the invention is a hybrid structure using a multilayer polymer-metal system to interconnect integrated circuits which allows electrical and/or optical connections to be made between integrated circuits arranged in two dimensions on a plane produced using the methods described in the previous paragraphs.

Another embodiment of the invention is a three-dimensional system to interconnect integrated circuits in which several self-supporting two-dimensional multilayer systems produced as described in the previous paragraphs are stacked and connected together, the connections being made, in particular, on the face of the multilayer system made accessible by removing the substrate.

BRIEF DESCRIPTION OF THE DRAWINGS

The invention will be better understood, and other advantages will become clear, upon reading the following description, which is not exhaustive, and by studying the appended figures including:

FIGS. 3 to 6 which schematically illustrate the main steps in a process to manufacture a multilayer polymer-metal system to interconnect integrated circuits in two dimensions (2D) according to the invention;

DETAILED DESCRIPTION OF THE INVENTION

The same reference numbers are used to identify the same components on each figure.

Figure 1:
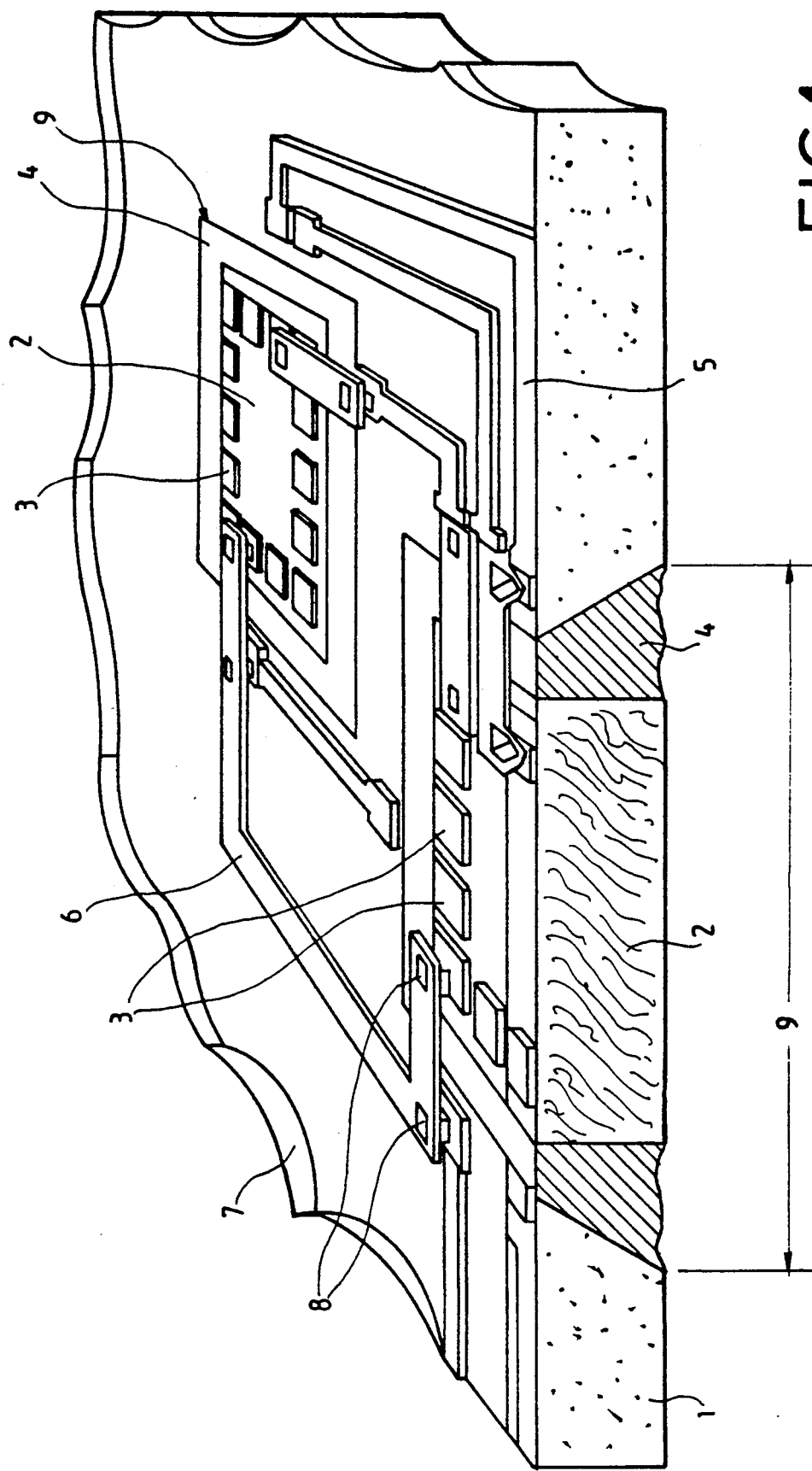
FIG. 1, already mentioned, which is a perspective view of an example of an electrical interconnection system on a substrate known in the prior art.

FIG. 1 illustrates the prior art and shows substrate 1, for example of silicon, which carries a first metal interconnection layer 5 and in which recesses 9 have been machined to insert integrated circuits 2 with their connection pads, after which a planarizing resin 4 has been added to fill the space around the circuit so that the first dielectric insulating layer 7, for example of polymer, can be deposited on the first metal interconnection layer 5. To allow electrical connections to be made through this dielectric layer, holes, known as "vias" 8 are produced in the dielectric layer at the required positions and a second metallization layer 6 can then be applied, using photolithographic methods or any other method, used in industry. Other dielectric and metallization layers (not shown) can then be applied in the same way until the degree of complexity required for the application is achieved.

Figure 2:
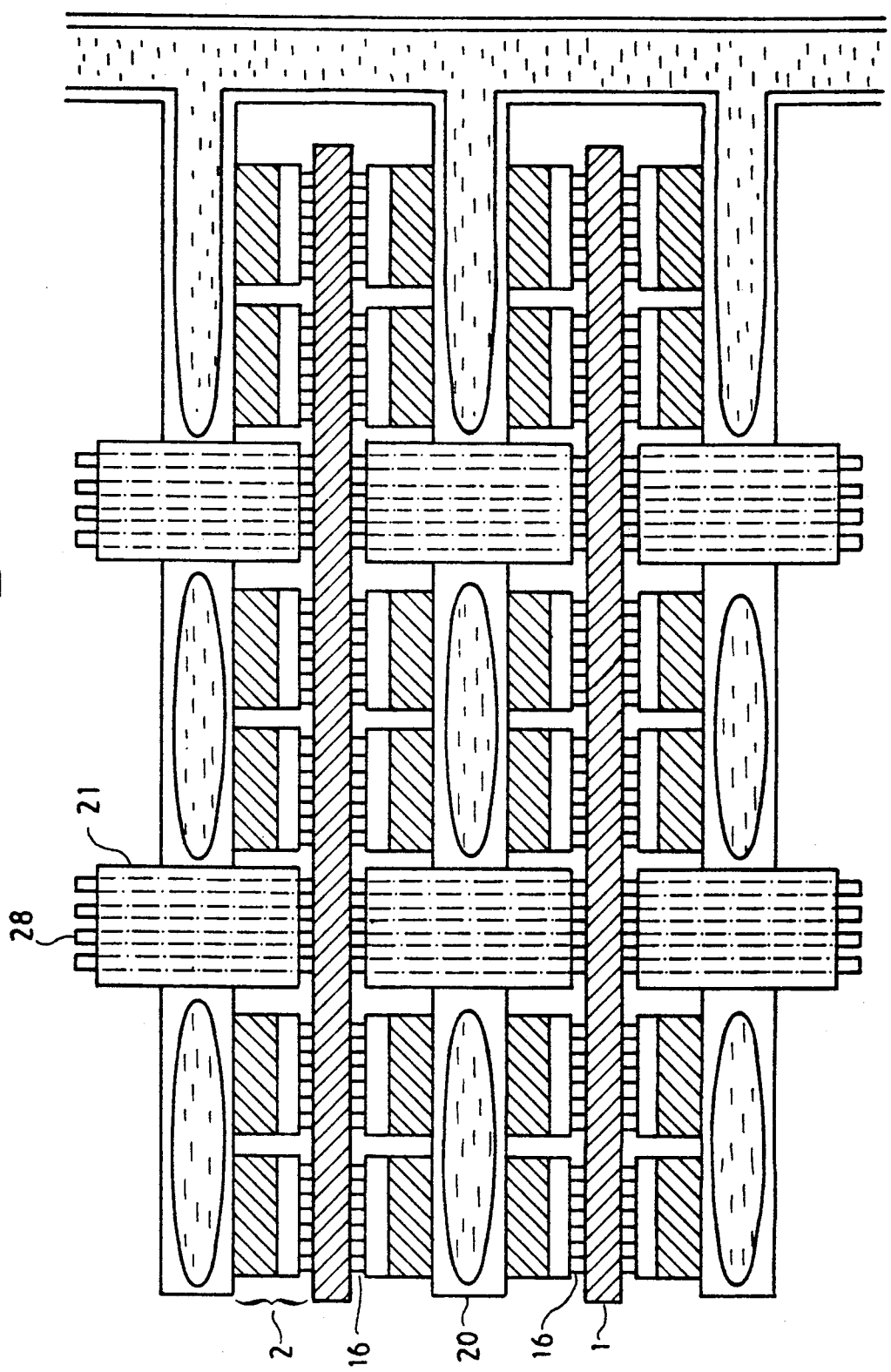
FIG. 2, already mentioned, which is an example of a three-dimensional electrical interconnection system produced by stacking interconnection systems on a substrate as known in the prior art.

FIG. 2 shows an example of a three-dimensional (3D) interconnection system according to the prior art and produced by stacking 2D systems. Substrate 1, for example of silicon, with its metal/dielectric interconnection layers (not shown), carries integrated circuits 2 mounted on both sides using metal bumps 16 and the method known in industry as "flip chip".

The heat dissipated by the chips is evacuated by heat pipes 20 which may be simple "heat sinks" to conduct away the heat or may allow a cooling fluid to flow. Electrical interconnections between 2D structures are made by vias 28 running through structural components 21 and connected at their ends by metal bumps 16 and by vias (not shown) produced through substrates 1.

This schematic diagram shows the large proportion of the volume occupied by substrate 1.

FIGS. 3 to 6 illustrate steps in an example of a process to manufacture electrical interconnection system according to the invention.

FIG. 3 schematically shows the first step which consists in depositing a first polymer layer 17, a few microns thick, on substrate 1, which can advantageously be silicon or silica used in microelectronics, such that the layer can subsequently be easily separated from the substrate.

This can be, for example, a layer of polyimide 17 deposited by techniques known to the industry, such as spin coating or spraying a polyamic acid solution or soluble polyimide onto the substrate. This type of deposit can be stripped or peeled by soaking in a polar liquid such as, for example, water, possible using ultrasound to strengthen the effect. Again, it can be a layer deposited by bonding or rolling a film of polymer 17 onto a substrate using a thermoplastic or soluble adhesive. The bonded layer can then be separated from the substrate by heat or a solvent.

FIG. 4 shows the second step which consists in producing a multilayer metal/polymer electrical interconnection system as known in the art, of which a few examples were given in the previous figures.

An adhesion-improving product can be used to avoid separation of the layers in the wafer or the system can be co-cured after deposition.

FIG. 4 shows substrate 1, the first polymer layer 17 and then several metal interconnection layers 5, 6, etc. separated by layers of polymer 7 with conductive vias 8 through the polymer layers to connect the different interconnection layers as in the previous case. Connection pads 33 are produced on the last metallization layer; these will subsequently be connected to the corresponding pads on the chips installed later. The chips are then installed using the assembly method selected by the designer (wire bonding, TAB, flip-chip).

The flip-chip method is particularly advantageous when used with this invention and is described more specifically in FIGS. 4 to 7. Metal bumps 16 are previously formed on each of the connection pads 3 for chips 2 and these bumps are then connected to the multilayer interconnection system pads 33 by remelting. This technique guarantees better positioning of chips 2 because they tend to self-center due to the surface tension of the small drops of liquid metal. The density of the connections which can be produced with this technique is also improved since the position of the pads 3 need not be limited to the periphery of the chip and there can, therefore, be a considerably greater number of connections. Finally, faulty circuits can easily be removed by remelting the bumps and, therefore, the system is easier to repair.

A variant of the flip-chip technique can also be used; this involves forming the bumps of thermoplastic resin containing an electroconductive filler instead of metal or metal alloy. The use of this type of material makes repairs even easier and its mechanical flexibility reduces the stresses generated by differences in the coefficients of expansion of the chips and the interconnection system.

The multilayer interconnection system is referred to as item 99.

Figure 5:
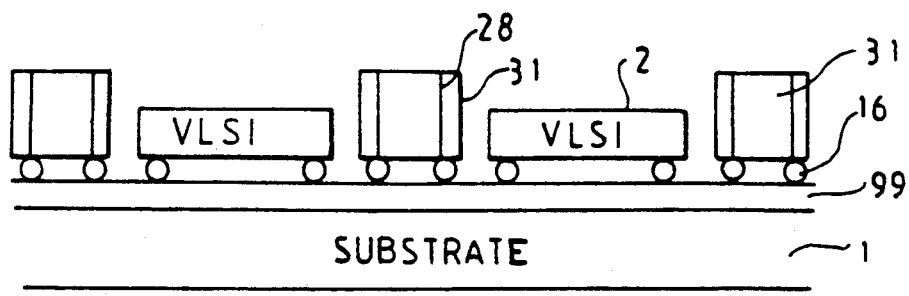

In the next step, shown in FIG. 5, a stiffening element, such as frame 31, is fixed and connected to the interconnection system 99, preferably but not exclusively by bumps identical to bumps 16 used to attach chips 2 to the interconnection system 99 in the flip-chip method described above. This frame contains holes corresponding to the positions of chips 2 and preferably includes a system of conductors 28 running through it from one face to the other perpendicular to the surface of multilayer system 99 carrying chips 2.

This frame can be of any conductive material (metal) or a dielectric (ceramic, insulating silicon, glass, polymer, etc.) and can be molded, machined from solid or be an assembly of parts. The material and dimensions can be selected to match the design of the application and to extract heat or to form the electrical ground or, again, to serve as a mechanical support for a package or for electrical connections to the outside.

The frame could, for example, advantageously be produced in a high-temperature thermosetting or thermoplastic polymer (for example condensation polyimide or polyimide with epoxy additive, polyetherimide, polyethersulfone, polyetheretherketone, phenyl polysulfide, liquid crystal polymer, etc.).

The conductive network 28 in the frame can be produced by inserting conductors during molding or by drilling and then filling with a conductive deposit or by any other method. If a conductive frame is used, this network is insulated inside the conductive frame and can then be used as transmission lines shielded by the frame itself; this can be an advantage in protecting the signals transmitted against any electromagnetic interference.

Figure 6:
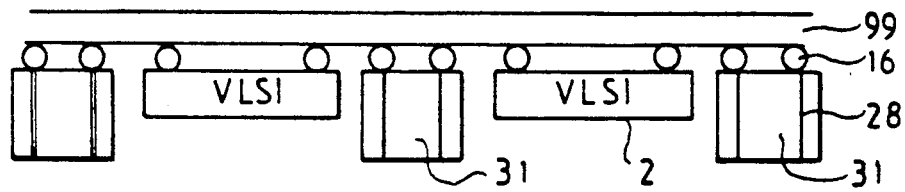

The last step, shown in FIG. 6, consists in removing substrate 1, leaving frame 31 and chips 2 attached to the interconnection system 99 by bumps 16. The frame keeps the assembly rigid.

Figure 7:
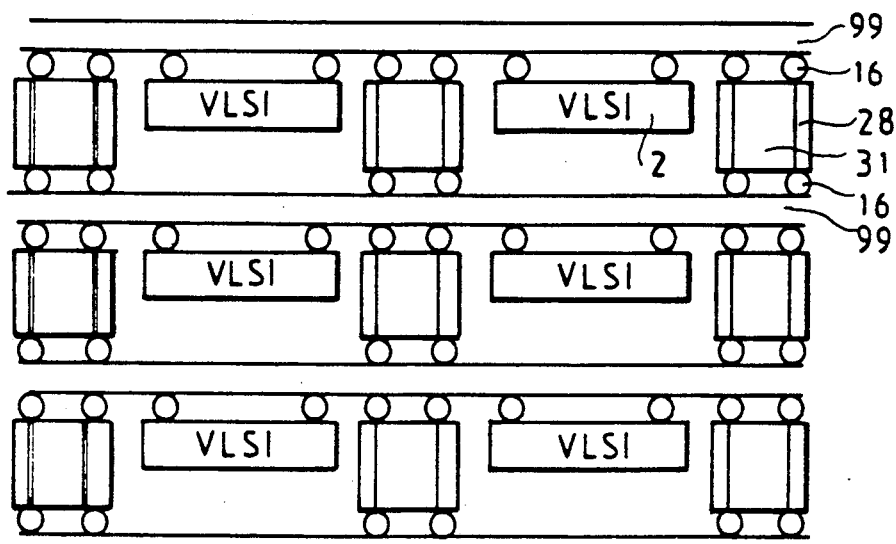
FIG. 7 schematically illustrates an example of a three-dimensional interconnection system produced by stacking 2D interconnection systems according to the invention, FIGS. 8a and 8b schematically shows a top view and cross-section of a two-dimensional optical and electrical interconnection system.

Once the substrate is removed, bumps can be produced on the other face of the interconnection system 99 and these vias can be connected to the network of conductors 28 within the frame 31 network; these bumps then allow the 2D systems to be stacked into a 3D system as shown on FIG. 7. The connections between the stacked 2D systems are made through the conductor network 28 (already described) in rigid frames 31.

The frame dimensions are chosen to allow the circuits in a 2D system and the 2D systems in a 3D system to be spaced to optimize the density of electronic components allowing for cooling needs, which may be satisfied as shown in FIG. 2 by adding heat sinks (heat-conducting rods in contact with the free side of chips and running through frames 31 to the outside) or by a cooling fluid (air, "FREON", FLOURINET, etc.) flowing through the rigid frame 31 to cool the chips the frame surrounds.

FIG. 8 shows, schematically, a top view (8B) and a cross-section (8A) of a 2D example of a variant of the invention comprising optical connections between optoelectronic devices.

As in the previous cases, the flip-chip technique is used only for purposes of illustration for electrical interconnections with the chips. As in the previous cases, the chips which, in this case, are optoelectronic devices 22, are assembled on a self-supporting metal-polyimide electrical interconnection system 99 held rigid by frame 31 and including vias 28 if the 2D assembly is to be stacked to form a 3D assembly. These optoelectronic devices may include both optoelectronic integrated circuits and conventional electronic integrated circuits (which require no optical interconnections) or, again, simple photodetectors or light signal emitters.

Compared to the interconnection systems shown on the previous diagrams, a last dielectric layer 77 is added between the multilayer interconnection system 99 and circuits 22 and frame 31. This dielectric layer is applied to the face of multilayer interconnection system 99 with its connection pads 33; however, the dielectric layer does not cover these pads. This dielectric layer 77 includes optical guides 71 used to transmit the light signals between devices requiring optical interconnection.

These optical guides may be produced by photolithographic techniques or by exposing a photosensitive polymer to UV radiation through a mask or again by reactive ion etching through an aluminum mask applied previously, thus forming tracks in the dielectric layer, these tracks having a different refractive index to the rest of the layer and thus acting as optical guides. They are shown as straight lines in FIG. 8 but can be of various and differing shapes to obtain the interconnections required.

In this example, diffractive networks (which can be produced by photolithography on the surface of the guides) provide optical coupling between the guides and the optoelectronic components.

What is claimed is:

1. A method for producing a multilayer polymer-metal system for interconnection of integrated circuits, compatible with two-dimensional electrical or optical connections, comprising the sequential steps of:
   (a) forming a multilayer interconnection system on a rigid substrate;
   (b) forming at least one integrated circuit on said multilayer interconnection system; and
   (c) removing said rigid substrate from said multilayer interconnections system, thereby leaving a self-supporting multilayer connection system.

2. A method of producing a multilayer polymer-metal system to interconnect integrated circuits as described in claim 1, in which a rigid frame is fixed onto the multilayer interconnection system to surround the chips before the rigid substrate is removed.

3. A method of producing a multilayer polymer-metal system to interconnect integrated circuits as described in claim 2 in which, before the rigid substrate is removed, said integrated circuits and said rigid frame are attached to the multilayer interconnection system by melting alloy bumps.

4. A method of producing a three-dimensional electrical or optical interconnection system in which the two-dimensional self-supporting multilayer interconnection systems are produced as described in claim 2 or 3 and in which said rigid substrate is removed; connection pads are produced on the first layer of the said multilayer system, on the face of the multilayer interconnection system exposed by removal of the said substrate; and in which the two-dimensional multilayer interconnection systems are then stacked and connected together by said connection pads and said rigid frame.

5. A hybrid structure consisting of integrated circuits and a multilayer polymer-metal system to interconnect these circuits which allows electrical or optical connection between said integrated circuits, arranged on a two-dimensional plane, in which the said multilayer system is produced as described in claim 1.

6. A hybrid structure as described in claim 5 which includes:
   a multilayer interconnection system with one or several connection pads on at least one of its main faces,
   at least one integrated circuit with one or several connection pads electrically connected to pads on the system,
   and at least one stiffening element mechanically attached to the said main face.

7. A hybrid structure as described in claim 6 in which the stiffening element is a frame which surrounds the integrated circuit.

8. A hybrid structure as described in claim 7 in which conductors run through the said frame.

9. A hybrid structure as described in claim 7 in which said frame is of a conductive material and said conductors running through it are insulated from said frame such that said frame forms a shield for these conductors.

10. A hybrid structure as described in any of claims 5 to 9 which includes a stack of structures to form a three-dimensional integrated circuit interconnection system.

11. A structure as described in any of claims 5 to 9 in which the multilayer interconnection system includes optical guides to transmit optical signals.

* * * * *